(12) United States Patent
Einbinder

(10) Patent No.: US 7,773,707 B2
(45) Date of Patent: Aug. 10, 2010

(54) TUNABLE NARROW BAND FILTER

(75) Inventor: Stephen B. Einbinder, Plantation, FL (US)

(73) Assignee: Motorola, Inc., Schaumburg, IL (US)

( * ) Notice: Subject to any disclaimer, the term of this patent is extended or adjusted under 35 U.S.C. 154(b) by 937 days.

(21) Appl. No.: 11/461,348

(22) Filed: Jul. 31, 2006

(65) Prior Publication Data

US 2008/0025445 A1    Jan. 31, 2008

(51) Int. Cl.
*H04B 1/10* (2006.01)
*H04H 5/12* (2006.01)
(52) U.S. Cl. .......................... 375/350; 334/15
(58) Field of Classification Search ................. 375/346, 375/350; 333/17.1, 17.3, 167, 174–175; 334/15
See application file for complete search history.

(56) References Cited

U.S. PATENT DOCUMENTS

| | | | | | |
|---|---|---|---|---|---|
| 4,662,001 | A | * | 4/1987 | Cruz et al. | ................. 455/340 |
| 5,148,133 | A | * | 9/1992 | Zennamo et al. | ............ 333/175 |
| 5,285,179 | A | * | 2/1994 | Wignot et al. | ................ 334/15 |
| 5,574,413 | A | * | 11/1996 | Ruelke | ...................... 333/174 |
| 6,441,701 | B1 | | 8/2002 | Hernandez | |
| 7,012,483 | B2 | * | 3/2006 | York | .......................... 333/171 |
| 2001/0013132 | A1 | * | 8/2001 | Kudo et al. | ................ 725/111 |
| 2005/0040909 | A1 | * | 2/2005 | Waight et al. | ............. 333/17.1 |

FOREIGN PATENT DOCUMENTS

| WO | 2008016773 A2 | 2/2008 |
|---|---|---|
| WO | 2008016773 A3 | 2/2008 |

OTHER PUBLICATIONS

PCT International Preliminary Report Application No. PCT/US2007/073583 dated Feb. 12, 2009—6 pages.
PCT International Article 19 Amendment as filed dated Feb. 19, 2008—6 pages.
PCT International Search Report and Written Opinion Application No. PCT/US2007/073583 dated Feb. 7, 2008—7 pages.

* cited by examiner

*Primary Examiner*—Khanh C Tran

(57) ABSTRACT

A tunable narrow band radio frequency (RF) filter (200) includes an RF input (225), an RF output (227), a capacitive network (201-209) for coupling the RF input (225) with the RF output (227) and an inductive network (219-223) for resonating the filter at a predetermined center frequency. A number of semiconductor devices such as varactor diodes (215, 217, 229, 233) are used for tuning respective capacitors in the capacitive network (201-209). A single voltage source ($V_c$) is used for tuning each one of the respective varactor diodes for moving the resonant frequency of the filter over a substantially wide frequency range.

6 Claims, 4 Drawing Sheets

TUNABLE NARROW BAND FILTER

FIELD OF THE INVENTION

The present invention relates generally to electrical filtering circuits and, more particularly, to narrow band filters tunable over a wide radio frequency (RF) bandwidth.

BACKGROUND

RF receiver circuits typically use narrow band filtering techniques in order to prevent undesired radio signals and spurious emissions from entering the front end amplifier of the radio. Allowing such undesired signals greatly impacts receiver performance since these undesired RF signals can cause interference with the intended mixing products within the receiver. When seeking a wider operating bandwidth for the receiver while still maintaining high performance, it is often necessary to utilize a tunable filter in order to cover a larger frequency spectrum. Tunable filters can work to optimize receiver performance by effectively tuning a narrow bandwidth filter over a wide frequency range. This gives the receiver highly selective performance since the filter can achieve the maximum attenuation in undesired frequencies which are detrimental to receiver performance.

A problem in using these types of filters is that the bandwidth and shape of the filter can vary over a given operating frequency. This occurs especially when trying to tune the filter over a wide frequency range, i.e., greater then 25 MHz. For example, FIG. 1 illustrates a schematic diagram of a well known narrow band filter used in the prior art. In operation, capacitors 101-109 form a split capacitive network which is connected to varactor diodes 115, 117. Similarly, inductors 119-123 form an inductive network which works to operate in combination with the split capacitive network to achieve filtering at some desired operating frequency. Varactor diodes 115, 117 are used with tuning voltage source $V_L$ through their respective resisters 111, 112, allowing the filter's frequency of optimal attenuation to be tuned. Thus, this allows RF signals to pass through an input port 125 of the filter to an output port 127 where a predetermined center frequency of the signal is attenuated to a desired level.

FIG. 2 is a graph illustrating return loss of the filter versus operating frequency of the filter shown in prior art FIG. 1. The frequency range depicted in the graph is approximately 260 MHz. Those skilled in the art will recognize that the bandwidth where the filter can achieve 30 dB of attenuation is only in a range of less than 20 MHz. Thus, as the frequency of the filter is tuned from its center frequency, it becomes less and less effective as it attenuates less signal. Although the filter may be tuned using its inductive network, it will only effectively tune within this very limited range. Consequently, as the filter increases bandwidth to points away from its center frequency it becomes less than optimal in achieving a desired amount of attenuation.

Hence, the need exists for a new filter topology having a sharp filter response that is tunable over a substantially wide frequency range.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
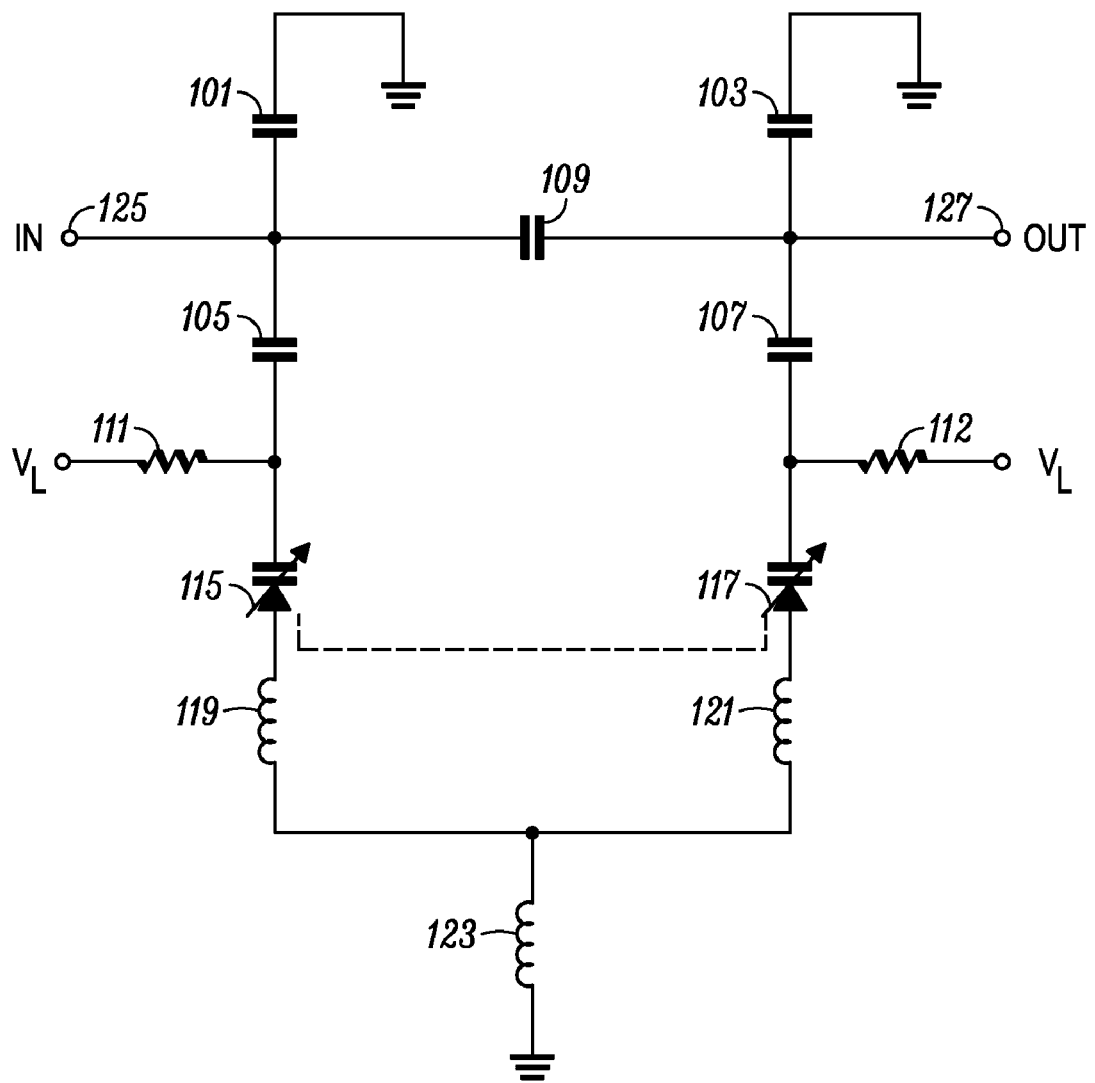
FIG. 1 is schematic diagram of a prior art filter circuit.
Figure 2:
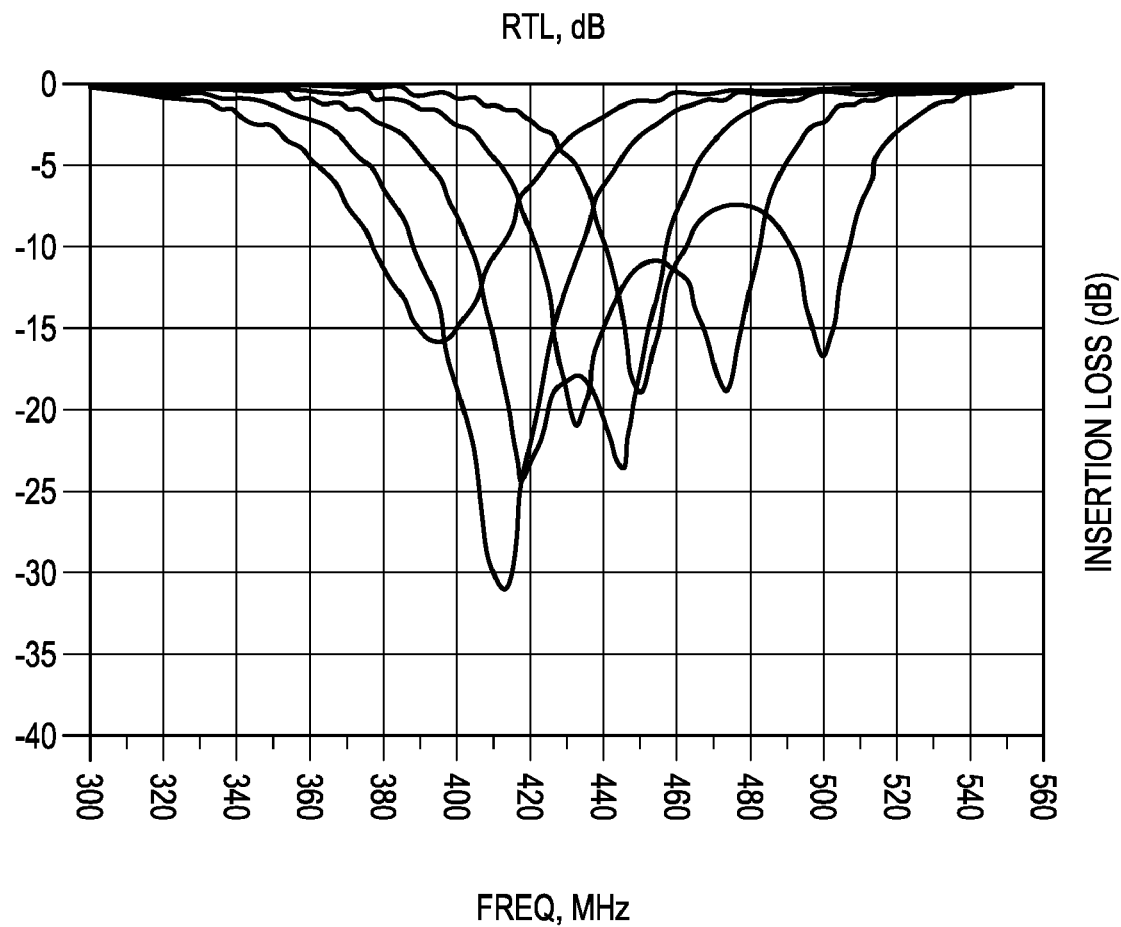
FIG. 2 is a graph illustrating return loss (RTL) versus operating frequency of the filter circuit shown in FIG. 1.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to a tunable narrow band filter. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

It will be appreciated that embodiments of the invention described herein may be comprised of one or more conventional processors and unique stored program instructions that control the one or more processors to implement, in conjunction with certain non-processor circuits, some, most, or all of the functions of a tunable narrow band filter described herein. The non-processor circuits may include, but are not limited to, a radio receiver, a radio transmitter, signal drivers, clock circuits, power source circuits, and user input devices. As such, these functions may be interpreted as steps of a method to perform a tunable narrow band filter. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Figure 3:
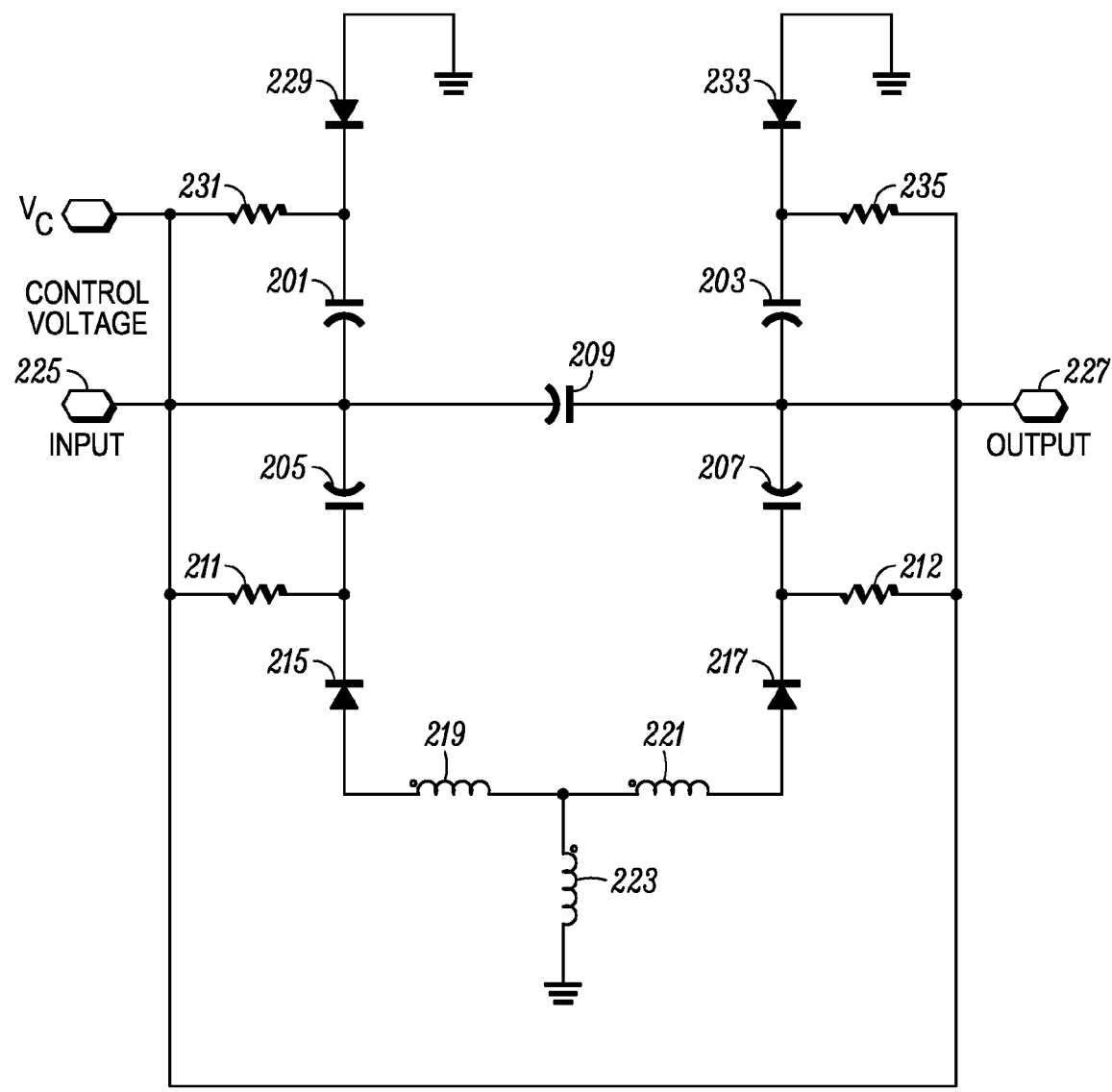
FIG. 3 is a schematic diagram of a narrow band filter circuit tunable over a substantially wide range of frequencies in accordance with an embodiment of the invention.

FIG. 3 illustrates a schematic diagram of the tunable narrow band filter 200 in accordance with an embodiment of the present invention. Capacitors 201-209 form a split capacitive network. An RF input 225 is positioned between capacitors 201, 205. A coupling capacitor 209 couples an RF output 227 located between capacitors 203, 207. Varactor diodes 215, 217 connect the capacitive network to an inductive network formed by inductors 219, 221 and 223. A second set of varactor diodes 229, 233 is attached to capacitors 201, 203, respectively. A control voltage source $V_c$ connects to each of its respective diodes 215, 217, 229, 233 through resisters 211, 212, 231, 235, respectively. Thus, the control is used to supply a common tuning voltage to the varactor diodes 215, 217, 229, 233 which tunes capacitors 201, 203, 205, 207 such that they are all gang tuned in a proportional manner. By tuning capacitors 201, 203, 205 and 207 the filter can be tuned across a substantially large bandwidth while still maintaining optimal attenuation. Those skilled in the art will recognize that varactor diodes 215, 217 provide the majority of the frequency tuning by effectively changing the inductive reactance of inductors 219, 221. Capacitors 201, 203 must be precisely selected so that the proper impedance ratio is maintained across the tuned band. In one case, capacitors 201 and 203 are substantially equal while capacitors 205, 207 are also substantially equal. Varactor diodes 215, 217, 229, 233 are also substantially equal in value. This allows the filter 200 to maintain a narrow bandwidth while still allowing it to be tuned over a substantially wide frequency range to achieve desired signal attenuation.

Figure 4:
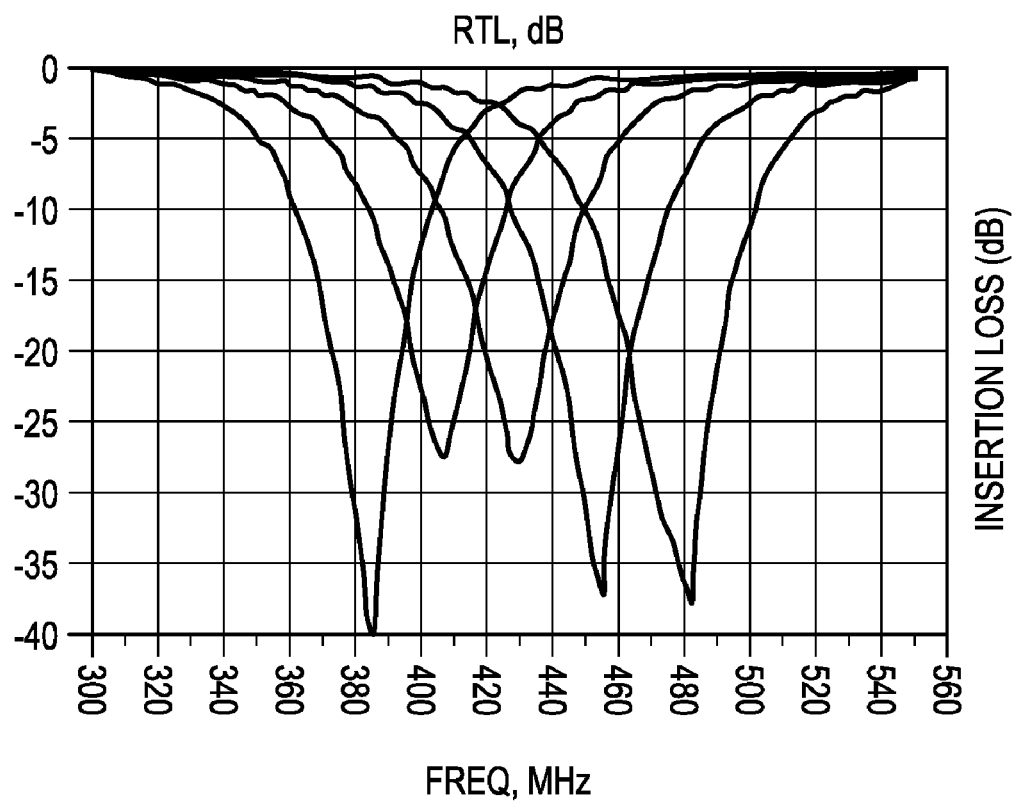
FIG. 4 is a graph illustrating return loss (RTL) versus operating frequency of the filter circuit shown in FIG. 3.

FIG. 4 is a graph illustrating the filter return loss versus frequency of the tunable narrow band filter over a frequency range of approximately 100 MHz for the filter circuit 200 shown in FIG. 3. The addition of the tuned capacitive network allows the filter to achieve a 30 dB attenuation bandwidth of approximately 260 MHz. This permits the filter to be much more versatile for wide band applications where the filter 200 can be tuned over a much wider frequency range to attenuate signals of a desired frequency.

Thus, the present invention is a narrow band filter tunable over a wide frequency range utilizing a capacitive and inductive network that utilizes a plurality of varactor diodes for tuning a capacitive network over a substantially wide frequency range.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

I claim:

1. A tunable narrow band radio frequency (RF) filter comprising:
    an RF input;
    an RF output;
    a split capacitive network comprising a coupling capacitor between the RF input and the RF output, and first and second capacitors coupled to the RF input, and third and fourth capacitors coupled to the RF output;
    an inductive network for resonating the filter at a predetermined center frequency;
    a plurality of semiconductor devices individually coupled to each of the first, second, third and fourth capacitors, each semiconductor device for tuning its respective capacitor within the split capacitive network; and
    wherein a single voltage source is used for tuning each one of the semiconductor devices for moving the resonant frequency of the filter over a substantially wide frequency range.

2. A tunable narrow band RF filter as in claim 1, wherein the plurality of semiconductor devices are varactor diodes.

3. A tunable narrow band RF filter as in claim 1, wherein each of the plurality of semiconductor devices comprises a varactor diode, each varactor diode being ganged tuned using the common tuning voltage to tune each of the first, second, third and fourth capacitors in a proportional manner.

4. A method for providing a narrow band radio frequency (RF) filter operable over a substantially wide frequency range comprising the steps of:
    providing a capacitive network comprising a plurality of capacitors formed of first and second capacitors coupled to an RF input, and third and fourth capacitors coupled to an RF output;
    providing an inductive network to resonate the filter at a predetermined center frequency;
    connecting the capacitive and inductive network to form a narrow band RF filter;
    providing a varactor diode tuning network operable from a common control voltage source attached to the capacitive network, wherein the varactor diode tuning network comprises a plurality of varactor diodes, and each of the plurality of capacitors has one of the plurality of varactor diodes coupled thereto; and
    independently tuning each of the varactor diodes in the varactor diode network in a ganged manner using the common control voltage source so as to tune the plurality of capacitors in a proportional manner and set the narrow band filter at an optimal frequency of attenuation.

5. A method for providing a narrow band RF filter as in claim 4, further comprising the step of:
    associating at least one varactor diode in the varactor diode tuning network with at least one capacitor in the capacitive network.

6. A method for providing a narrow band RF filter as in claim 4, further comprising the step of:
    adjusting the common control voltage source in order to tune the narrow band RF filter for operating at a desired frequency.

* * * * *